(12) United States Patent
Kudo et al.

(10) Patent No.: US 8,487,590 B2
(45) Date of Patent: Jul. 16, 2013

(54) CELL CONTROLLER HAVING A UNIT CELL VOLTAGE DETECTING SECTION

(75) Inventors: Akihiko Kudo, Ibaraki (JP); Masaki Nagaoka, Ibaraki (JP); Kenichiro Tsuru, Ibaraki (JP); Mutsumi Kikuchi, Ibaraki (JP); Tatsumi Yamauchi, Ibaraki (JP); Akihiko Emori, Ibaraki (JP)

(73) Assignee: Hitachi Vehicle Energy, Ltd, Ibaraki (JP)

( * ) Notice: Subject to any disclaimer, the term of this patent is extended or adjusted under 35 U.S.C. 154(b) by 796 days.

(21) Appl. No.: 12/054,890

(22) Filed: Mar. 25, 2008

(65) Prior Publication Data

US 2009/0021222 A1    Jan. 22, 2009

(30) Foreign Application Priority Data

Jul. 19, 2007   (JP) .................. 2007-188549

(51) Int. Cl.
*H02J 7/06*    (2006.01)
*H02J 7/00*    (2006.01)

(52) U.S. Cl.
USPC .......................................... 320/163; 320/122

(58) Field of Classification Search
USPC ................. 320/132, 116, 118, 122, 152, 157, 320/162–163
See application file for complete search history.

(56) References Cited

U.S. PATENT DOCUMENTS

| | | | |
|---|---|---|---|
| 6,208,117 B1 | 3/2001 | Hibi | |
| 7,759,902 B2 * | 7/2010 | Gangsto et al. | ............... 320/134 |
| 2006/0170398 A1 | 8/2006 | Gangsto et al. | |

FOREIGN PATENT DOCUMENTS

| | | |
|---|---|---|
| JP | A 2001-045670 | 2/2001 |
| JP | 2005-348457 | * 12/2005 |
| JP | A2005-348457 | 12/2005 |

(Continued)

OTHER PUBLICATIONS

Official Action (including English translation) issued by the Chinese Patent Office for Chinese Patent Application No. 200810088628.6, dated Aug. 9, 2010.

(Continued)

*Primary Examiner* — Richard V Muralidar
(74) *Attorney, Agent, or Firm* — Jason H. Vick; Sheridan Ross, PC

(57) ABSTRACT

A cell controller capable of ensuring high safety even when a short occurs among voltage detecting lines without causing increased costs is provided. The cell controller 10 includes a unit cell voltage detecting section 7 to detect a voltage of each unit cell 1 constituting a battery group through each voltage detecting line and a SOC adjusting circuit for adjusting a SOC of each unit cell 1 having resistors 2 for SOC adjustment, switching elements 6, and a bypass control section 8 to exercise on/off control on the switching elements 6. Each resistor 2 is connected in series to each voltage detecting line and the unit cell voltage detecting section 7 to detect a voltage of each unit cell 1 through each of the resistors 2. The bypass control section 8 lets the switching elements 6 corresponding to the unit cells 1 to be SOC-adjusted enter an ON state at a time of adjusting a SOC, and control is exercised so that each resistor 2 for SOC adjustment is connected in series to each voltage detecting line led from each positive and negative electrode of each unit cell 1 to be adjusted and each of the serially connected resistors 2 is connected in parallel to each unit cell 1 to be adjusted.

12 Claims, 3 Drawing Sheets

FOREIGN PATENT DOCUMENTS

| | | |
|---|---|---|
| JP | 2006-042410 | 2/2006 |
| JP | A 2006-078850 | 3/2006 |
| WO | WO 2006/078850 | 7/2006 |
| WO | WO 2006/108081 | 10/2006 |

OTHER PUBLICATIONS

European Search Report for European Patent Application No. EP 08153340.8, mailed Dec. 20, 2010.

"ATmega406 Preliminary" Jul. 1, 2006, XP002605949 ATMEL Corporation; www.atmel.com/dyn/resources/prod_documents/doc2548.pdf, pp. 1; 116-120; and 136.

Official Action (including English translation) for Japanese Patent Application No. 2007-188549, mailed Jan. 24, 2012.

Official Action (including English translation) for Japanese Patent Application No. 2007-188549, mailed Apr. 17, 2012.

Decision of Rejection (including English translation) for Chinese Patent Application No. 200810088628.6, mailed Mar. 1, 2012.

\* cited by examiner

CELL CONTROLLER HAVING A UNIT CELL VOLTAGE DETECTING SECTION

CROSS REFERENCE TO RELATED APPLICATIONS

This application claims the benefit under 35 U.S.C. 119(a) to Japanese Application No. JP 2007-188549 filed Jul. 19, 2007, the entire disclosure of which is incorporated herein by reference in its entirety.

FIELD OF THE INVENTION

The present invention relates to a cell controller and more particularly to a cell controller having a unit cell voltage detecting section which detects a voltage of each unit cell constituting a battery group through each voltage detecting line and having a SOC adjusting section which adjusts a SOC of each unit cell and which has resistors for SOC adjustment, switching elements and a control unit for exercising ON/OFF control on the switching elements.

DESCRIPTION OF THE RELATED ART

Conventionally, as a charging control system of a battery, group (battery pack), the charging/discharging control system has been used in which a charging/discharging apparatus is connected to a positive (+) terminal and a negative (−) terminal of the battery group. Moreover, in a lithium-ion battery having become commercially practical recently, a cell controller to measure a voltage of each unit cell making up a battery group and to perform SOC adjustment or quantity of electricity adjustment of each unit cell (in other words, to maintain cell balance) is used. The reason for requiring the SOC adjustment is that, if a charging state varies among unit cells, chargeable and dischargeable capacity (quantity of electricity) as the battery group becomes the smaller and a battery life is shortened. In the case of a nickel-hydrogen battery, by letting each unit cell making up a battery group enter an overcharging state, it is possible to maintain cell balance. However, in the case of the lithium-ion battery using a non-aqueous organic solvent for electrolyte, it becomes a problem in terms of safety of a battery if a unit cell falls into an overcharging state. Accordingly, a function of measuring a voltage of each unit cell and a function of adjusting SOC by which a charging state among unit cells can be made uniform are indispensable.

As technology of this type, a cell controller is disclosed having a unit cell voltage detecting circuit which detects a voltage of each unit cell constituting a battery group through each voltage detecting line and having a SOC adjusting circuit which adjusts a SOC of each unit cell and which has resistors, switching elements and a control unit for exercising ON/OFF control on the switching elements (ex. JP-A-2005-348457).

FIG. 2 is a configuration example thereof. In this example, a SOC of each of four unit cells 1 connected in series is adjusted, and each of the resistors 2 for adjusting a unit cell SOC and each of FETs (Field-Effect Transistors) 6 embedded in an integrated circuit 5 are connected to each of the four unit cells 1. Moreover, a voltage of each of the unit cells 1 is inputted through each of RC (Resistor-Capacitor) filters each made up of each of resistors 3 and each of capacitors 4 to the unit cell voltage detecting section 7. The above RC filter is used for noise-reduction and its use is indispensable in HEVs (Hybrid Electric Vehicles) in which much engine spark noise and inverter noise occur particularly, and, in some cases, a LC (Inductor-Capacitor) filter capable of providing more excellent noise-reduction characteristic is employed. A bypass control section 8 exercises ON/OFF control on each of the FETs 6 to adjust a SOC of each of the unit cells 1. The SOC adjustment is carried out by an unillustrated upper controller which receives data on a voltage of each of the unit cells 1 from the integrated circuits 5 and which issues a control command to the integrated circuit 5.

However, in the conventional cell controller, when a short occurs among the voltage detecting lines, there is a fear of causing flows of large current, heat generation, smoke generation, ignition, or a like. To solve this problem, a method is available in which a fuse is inserted to a side of a unit cell of the voltage detecting line. However, the method has a disadvantage that it causes an increase in costs because the fuse has to be connected to all the voltage detecting lines. Moreover, in the technology disclosed in the above JP-A-2005-348457, the cell controller is miniaturized by integrating component elements of the SOC adjustment circuit other than the unit cell voltage detecting circuit and resistors for adjusting a voltage into an integrated circuit. However, the cell controller has a problem in that the number of terminals of the integrated circuit is large. The large number of terminals of the integrated circuit causes its package to be made large in size, resulting in increased costs.

SUMMARY OF THE INVENTION

In view of the above circumstances, an object of the present invention is to provide a cell controller which is capable of ensuring high safety even when a short occurs among voltage detecting lines without causing increased costs.

To solve the above problems, the cell controller of the present invention includes a unit cell voltage detecting section which detects a voltage of each of unit cells constituting a battery group through each of voltage detecting lines and a SOC adjusting section which adjusts a SOC of each of the unit cells and which has resistors for SOC adjustment, switching elements and a control unit for exercising ON/OFF control on the switching elements, wherein each of the resistors is inserted in series to each of the voltage detecting lines and the unit cell voltage detecting section detects a voltage of each of the unit cells through each of the resistors, and wherein the control unit lets switching elements corresponding to unit cells to be adjusted enter an ON state at a time of SOC adjustment so that each of the resistors inserted to each of the voltage detecting lines each led from positive and negative electrodes of the unit cells to be adjusted is connected in series and each of the serially connected resistors is connected in parallel to each of the unit cells to be adjusted.

In the present invention, the resistors for SOC adjustment are inserted in series to the voltage detecting lines and the positive electrode and negative electrode of each of the unit cells are connected through each of the voltage detecting lines to the control circuit including the unit cell voltage detecting section, the switching elements or a like. Accordingly, currents flowing due to a short among the voltage detecting lines are limited and safety of the cell controller can be enhanced and, further, the resistors provided originally for SOC adjustment of each of unit cells are used also for a safety measure, thus preventing an increase in costs. In particular, in a configuration employed in the present invention, that the unit cell voltage detecting section, switching elements, and control section out of the SOC control section are housed in an integrated circuit, voltage detecting terminals used for connection of the unit cells to the unit cell voltage detecting section and conducting terminals used for connection of a drain and/or source of the switching element including FETs to the resistors for SOC adjustment are used commonly to reduce the number of the terminals, thereby enabling the reduction of costs for the integrated circuit.

In the embodiment of the present invention, in a case that, when a unit cell voltage is detected by the unit cell voltage detecting section, the control unit lets each of switching elements corresponding to each of unit cells whose voltage is to be detected and to each of unit cells disposed at higher and lower sides of the each of the unit cells whose voltage is to be detected enter an OFF state, no bypass currents flow at the time of detecting a voltage of each of the unit cells and no voltage drop caused by the resistors of SOC adjustment occurs, which enables the exact measurement of each of the unit cells. Further, when a configuration is employed that the control unit exercises control so that the unit cells whose voltage are to be detected are switched at every predetermined time, the bypass discharging by the resistors for SOC adjustment is stopped only at a time of detecting a voltage of each of the unit cells by using a simple circuit, for example, an oscillating circuit to detect a voltage of each of the unit cells. Furthermore, when a configuration is employed that the control section exercises control so that SOC adjustment is not performed simultaneously among unit cells adjacently disposed at higher and lower sides of each of unit cells constituting the battery group, normal conduction of the bypass current can be achieved. That is, if bypass discharging of unit cells adjacently disposed is performed at the same time, since no currents flow through the resistors for SOC adjustment connected to the voltage detecting lines commonly connected and no voltage drop occurs, resulting in the flow of bypass currents being larger than assumed, thus making it difficult to perform normal SOC adjustment of unit cells. In this configuration, in order to simplify the control, the control section may exercise control so that the unit cells to be adjusted are switched, at every predetermined time, between odd-numbered unit cells and even-numbered unit cells enumerated from a highest or lowest cell constituting the battery group. As described above, it is preferable that the unit cell voltage detecting section, switching elements, and control section making up the SOC adjusting section are housed in an integrated circuit. In a configuration of the present invention, all or part of the resistors is preferably located near the unit cells making up the battery group. The resistors except the resistors connected to a positive electrode of a highest unit cell and a negative electrode of a lowest unit cell out of the unit cells making up the battery group may be disposed near the unit cells constituting the battery group. Moreover, it is preferable that the cell controller further comprises capacitors connected in parallel through the resistors to each of unit cells making up the battery group, and the resistors and the capacitors function as a RC filter. The cell controller can suitably control a battery group operating as a power source for a hybrid electric vehicle.

According to the present invention, effects can be obtained that since the resistors for SOC adjustment are inserted in series into the voltage detecting lines and the positive electrode and negative electrode of each of the unit cells are connected through each of the voltage detecting lines to the control circuit including the unit cell voltage detecting section, the switching elements or a like, and since currents flowing due to a short among the voltage detecting lines are limited and safety of the cell controller can be enhanced, the resistors provided originally for SOC adjustment of each of unit cells are used also as a safety measure, thus preventing an increase in costs.

DETAILED DESCRIPTION OF THE PREFERRED EMBODIMENTS

Next, an embodiment of the cell controller of the present invention is described by referring to drawings.

(Constitution)

Figure 1:
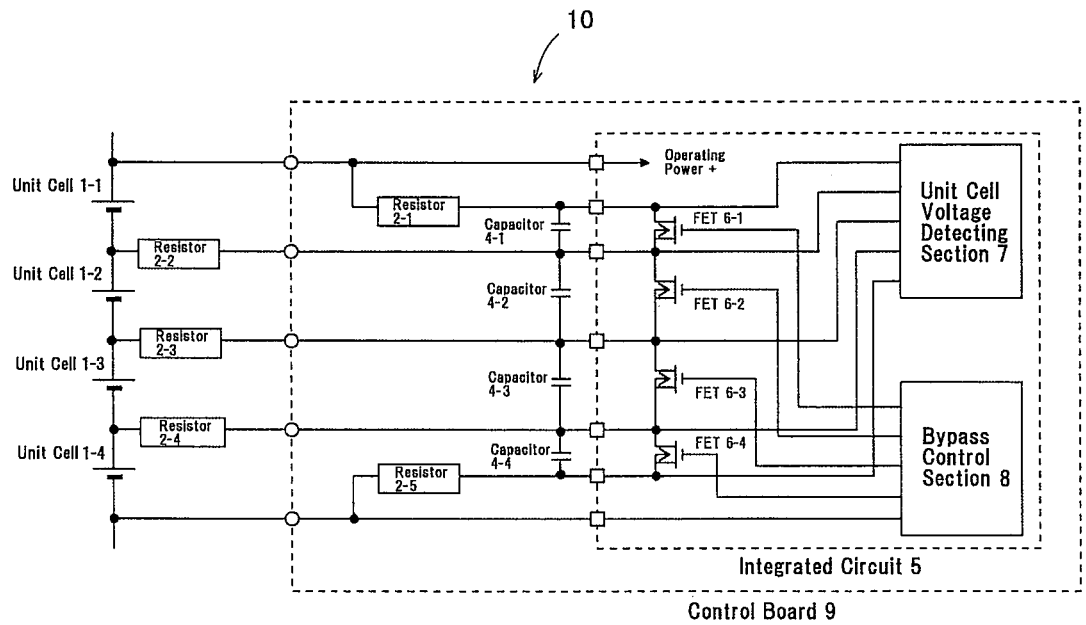
FIG. 1 is a block circuit diagram of a cell controller according to an embodiment of the present invention.

As shown in FIG. 1, the cell controller 10 includes a unit cell voltage detecting section 7 to detect a voltage of each of unit cells 1-1, 1-2, 1-3, and 1-4 making up a battery group through each of voltage detecting lines and a SOC adjusting circuit (SOC adjusting section) for adjusting a SOC of each of the unit cells 1 having SOC adjusting resistors 2-1, 2-2, 2-3, 2-4, and 2-5, FETs 6-1, 6-2, 6-3, and 6-4 serving as a switching element to supply a bypass current to the SOC adjusting resistors 2, and a bypass control section 8 serving as a control unit to exercise on/off control on the FETs 6.

The unit cell voltage detecting section 7, bypass control section 8, and FETs 6 (SOC adjusting circuit excluding the SOC adjusting resisters 2) are housed in the integrated circuit 5. The integrated circuit 5 is mounted in the control board 9 making up a main portion of the cell controller 10.

In this embodiment, four unit cells 1 making up a battery group each being connected in series are employed and each of voltage detecting lines routed from each terminal disposed between the highest-positioned unit cell 1 and the lowest-positioned unit cell 1 making up the battery group is connected to each of terminals of the integrated circuits 5 mounted on the control board 5 and power output from the terminals of the unit cells 1 is used as operating power for the integrated circuit 5. However, the start-up power for the integrated circuit 5 may be supplied from any outer unit other than the battery group (for example, from an upper controller operating to control the cell controller).

The resistors 2 for SOC adjustment are connected in series to the voltage detecting lines. That is, each of the voltage detecting lines routed from the positive and negative electrode of each unit cells 1 is connected to each of terminals of the integrated circuit 5 through each of the resistors 2 for SOC adjustment and, in the integrated circuit 5, each of the terminals of the integrated circuit 5 is connected to the unit cell voltage detecting section 7 and also to each drain of each of the FETs 6 (voltage detecting line routed from each positive electrode of each of the unit cells 1) through each of the resistors 2 for SOC adjustment or each source of the FETs 6 (voltage detecting line routed from each negative electrode of each of the unit cells 1) through each of the resistors 2 for SOC adjustment. A gate of each of the FETs 6 is connected to the bypass control section 8 and the FETs 6 are on/off controlled by the bypass control section 8.

Between terminals each being connected to each of the resistors 2 for capacitor adjustment is connected, in parallel, each of capacitors 4-1, 4-2, 4-3, and 4-4 and the capacitors 4 together with the resistors 2 for capacitor adjustment makes up a RC filter for the unit cell voltage detecting section 7. Moreover, in the conventional cell controller, the RC filter is inserted into the unit cell voltage detecting section 7 to reduce noise (see FIG. 2), however, in this embodiment, the resistors 2 for SOC adjustment serve also as the "R" of the RC filter and, therefore, by selecting a proper capacitor for the "C" of the RC filter, the same frequency characteristics as in the conventional can be obtained. Additionally, in this embodiment, the resistors 2-1 and 2-5 for SOC adjustment are mounted on the control board 9 and the resistors 2-2, 2-3, and 2-4 are disposed near the unit cells 1 and connected to the control board 9.

(Operation)

Next, operations of the cell controller 10 of this embodiment are described. Moreover, a unit making up the main control portion may be a CPU (Central Processing Unit) (not shown) mounted in the integrated circuit 5, or a host controller may exert control thereon.

First, when a unit cell voltage is detected by the unit cell voltage detecting section 7, the bypass control section 8 exercises control so that each of the unit cells 1 whose voltages are to be detected and each of the FETs 6 corresponding to each of the unit cells 1 positioned on the higher and lower sides of each of the unit cells whose voltages are to be detected enter an OFF state. This is for the reason that, by interrupting the bypass current flowing through the resistors 2 for SOC adjustment when a cell voltage is being measured, the unit cell voltage detecting section 7 measures a voltage accurately in a state where no voltage drop caused by the bypass current occurs. By repeating this operation on each of the unit cells 1-1, 1-2, 1-3, and 1-4 in order at every specified time, it is made possible to accurately detect a unit cell voltage in a state in which the bypass currents are interrupted periodically.

Moreover, the voltage detection is allowed to be made at appropriate time intervals and, therefore, SOC adjustment of each of unit cells 1 can be performed while the voltage detection is not being made, thus enabling operations to achieve cell balance. The bypass control section 8 exerts control while the SOC adjustment is being performed so that each of the FETs 6 corresponding to each of the unit cells 1 to be SOC-adjusted enters an ON state and so that each of the resistors 2 for SOC adjustment connected in series to each of the voltage detecting lines routed from each of the positive and negative electrodes of each of the unit cells to be adjusted and also each of the serially connected resistors 2 for SOC adjustment is connected in parallel to each of the unit cells 1 to be SOC-adjusted.

Figure 3:
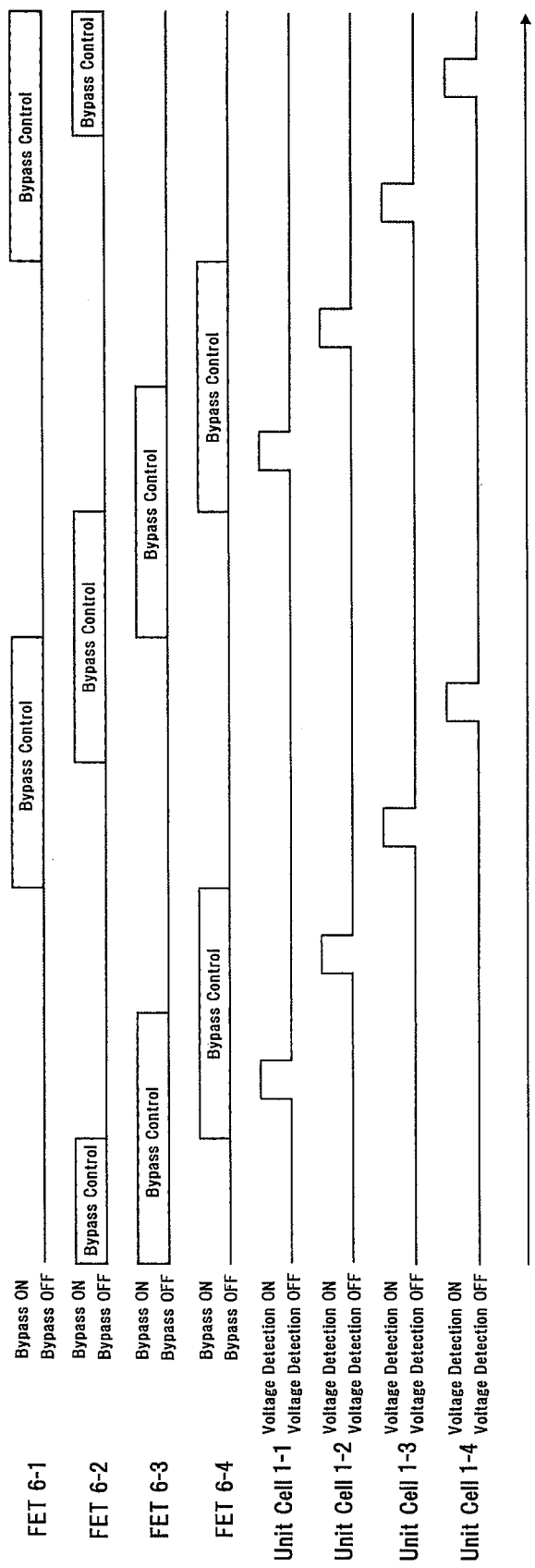
FIG. 3 is a timing chart explaining an operation sequence of the cell controller of the embodiment.

FIG. 3 shows an operation sequence of each component of the cell controller 10 of the embodiment. As shown in FIG. 3, by exercising control so as to let the FETs 6 enter an ON state (in the case of no need for the SOC adjustment, an OFF state is maintained) during the period of time described as "Bypass Control", operations of SOC adjustment of each unit cell 1 can be performed while the detection of a voltage is being made.

Figure 4:
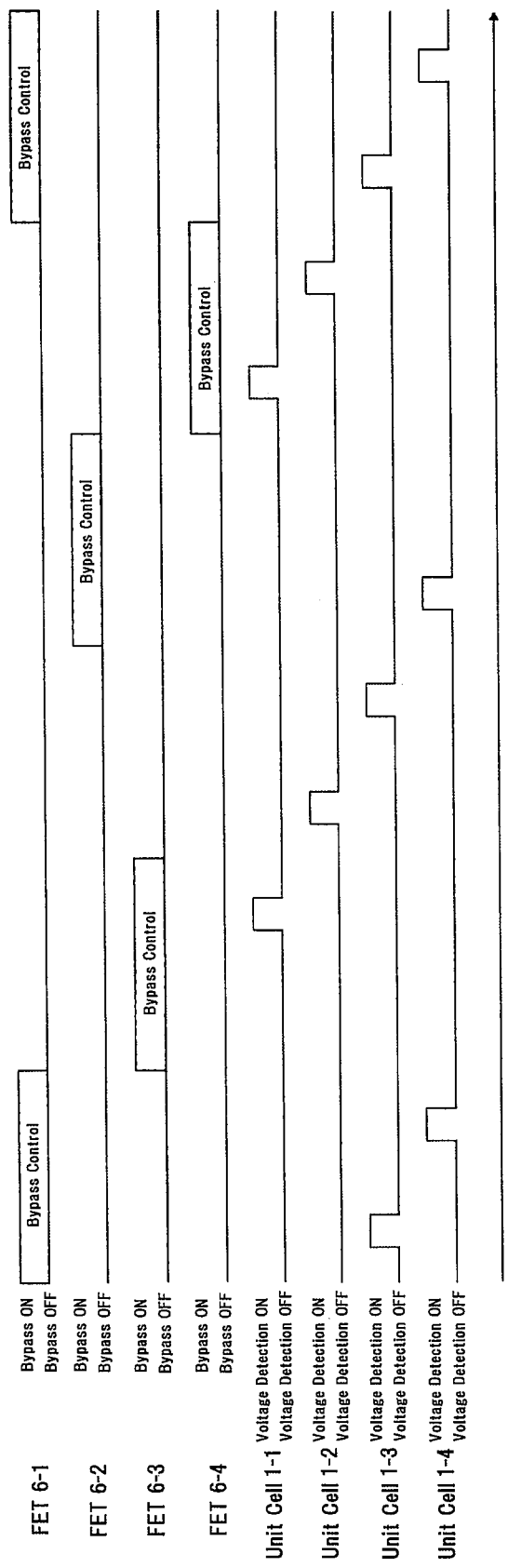
FIG. 4 is a timing chart explaining another operation sequence of the cell controller according to the embodiment.

In order to exercise control not to simultaneously perform SOC adjustment over unit cells 1 adjacently disposed on the upper and lower sides of the unit cells 1, control is exercised on the control section side so as not to simultaneously permit the flow of bypass currents for the unit cells being adjacent to each other on the control side. Alternatively, the control may be exercised so that unit cells to be SOC-adjusted are switched, at every specified time, from unit cells positioned on the upper or lower side to odd-numbered unit cells and even-numbered unit cells. FIG. 4 shows an operation sequence in this case. In the example, the control is exercised so that, in every operation of detecting voltages of all unit cells 1, an object to be bypass-controlled is switched to odd-number unit cells and even-numbered unit cells.

(Effects or the Like)

Next, effects or the like obtained by the cell controller 10 of the embodiment are described below.

In the cell controller 10 of the embodiment, the resistors 2 for SOC adjustment are connected serially to the voltage detecting lines and the positive and negative electrodes of each of the unit cells 1 are connected to the integrated circuit 5 via the voltage detecting lines and, therefore, currents flowing therein are limited even if a short occurs among the voltage detecting lines, thereby increasing safety of the cell controller 10 and, further, the resistors 2 to be originally used for SOC adjustment of each of the unit cells are also employed as a safety measure, thereby preventing an increase in costs.

Moreover, in the cell controller 10 of the embodiment, the SOC adjusting resistors 2-2, 2-3, and 2-4 are disposed near the unit cells 1 outside the control board 9. Therefore, even when a short occurs among the voltage detecting lines, the flow of currents are limited by the resistors 2, which enables the prevention of smoke generation, ignition, or the like. Also, the SOC adjustment for each of the unit cells 1 is performed by using two resistors 2 for SOC adjustment and, as a result, heat generation of each of the SOC adjusting resistors 2 can be prevented. Moreover, as is apparent from the comparison between FIG. 1 and FIG. 2, the number of resistors including the resistors 2 for SOC adjustment can be reduced.

Figure 2:
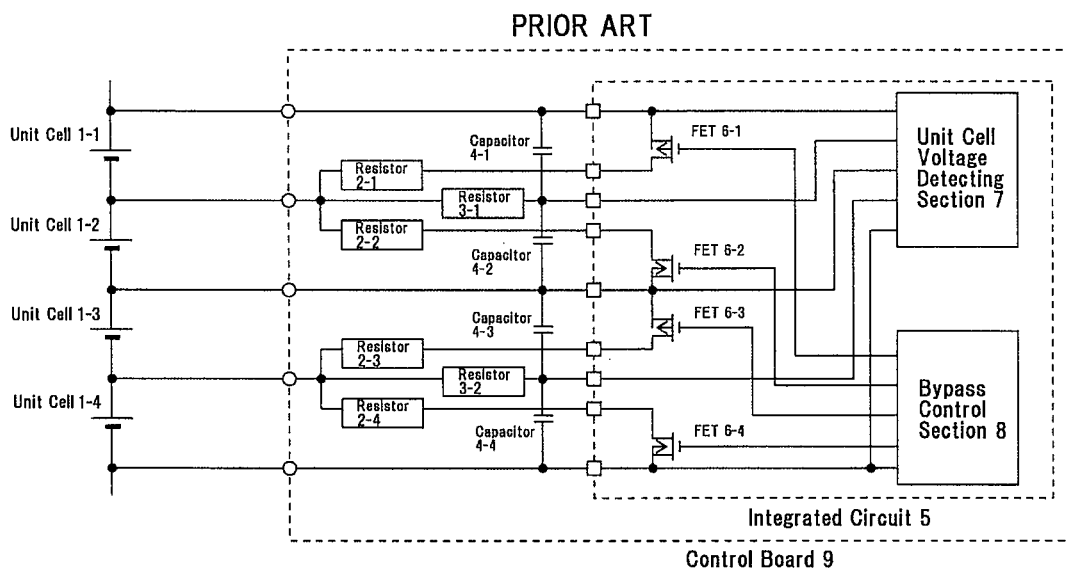
FIG. 2 is a block circuit diagram of a conventional cell controller.

Furthermore, the unit cell voltage detecting section 7, bypass control section 8, and FETs 6 are housed in the integrated circuit 5 and, therefore, the terminals used for the connection to the unit cell voltage detecting circuit and conducting terminals used to connect drains, sources, or the like of the FETs 6 to the SOC adjusting resistors 2 are used commonly, which enables the reduction of the number of terminals to be used, thus decreasing costs for manufacturing the integrated circuit. The number of the terminals in the conventional example shown in FIG. 2 is 9, however, the number of the terminals in the embodiment shown in FIG. 1 is successfully reduced to 7.

Additionally, in the above embodiment, the example is shown in which the SOC adjusting resistors 2-1 and 2-5 are mounted on the control board 9, however, the present invention is not limited to this and the SOC adjusting resistors 2-1 and 2-5, as in the case of the SOC adjusting resistors 2-2, 2-3, and 2-4, may be disposed near the unit cells 1 outside the control board 9.

INDUSTRIAL APPLICABILITY

The present invention has industrial applicability since it provides the cell controller capable of ensuring high safety even when a short occurs among voltage detecting lines without causing increased costs, thus making the cell controller be contributable to its manufacturing and sales.

What is claimed is:

1. A cell controller comprising:
a unit cell voltage detecting section which detects a voltage of each of a plurality of unit cells constituting a battery group through respective voltage detecting lines; and
a SOC adjusting section which adjusts a state of charge (SOC) of each of the plurality of unit cells and which includes: resistors for SOC adjustment, switching elements and a control unit mounted in a control board for exercising ON/OFF control on the switching elements;
wherein all or part of the resistors are disposed near the unit cells outside the control board,
wherein the control unit switches the switching elements to an OFF state at a time of voltage detection based on the voltage detecting section, and wherein the control unit detects a voltage of a particular unit cell and simultaneously performs SOC adjustment to other unit cells which are not immediately adjacent to the particular unit cell,
wherein, when a voltage of a first unit cell of the plurality of unit cells is detected, a first switch corresponding to the first unit cell is turned off to detect a voltage of the first unit cell, and, at a same time:
  a second switch corresponding to a second unit cell of the plurality of unit cells which is immediately adjacent to and connected electrically with the first unit cell is turned off, and another switch, corresponding to another unit cell of the plurality of unit cells, performs SOC adjustment to the another unit cell by turning the corresponding switch on to discharge power of the another unit cell, or
  a second switch corresponding to a second unit cell of the plurality of unit cells which is immediately adjacent to and connected electrically with the first unit cell is turned off and a third switch corresponding to a third unit cell of the plurality of unit cells which is immediately adjacent to and connected electrically with the first unit cell is turned off, and another switch corresponding to another unit cell of the plurality of unit cells, performs SOC adjustment to the another unit cell by turning the corresponding switch on to discharge power of the another unit cell,
wherein each of the resistors for a corresponding unit cell is inserted in series with respect to a corresponding voltage detecting line, and the unit cell voltage detecting section detects a voltage of each of the plurality of unit cells through the corresponding resistors, and wherein the control unit lets switching elements corresponding to respective unit cells to be adjusted enter an ON state at a time of SOC adjustment, so that the corresponding resistors respectively lead from positive and negative electrodes of the unit cells to be adjusted, and each of the serially connected resistors is connected in parallel to each of the unit cells to be adjusted,
wherein, when a unit cell voltage is detected by the unit cell voltage detecting section, the control unit lets each of the switching elements corresponding to each of the unit cells whose voltage is to be detected, and each of unit cells disposed at higher and lower sides of each of the unit cells whose voltage is to be detected, enter an OFF state, and
wherein the unit cell voltage detecting section, the switching elements and control unit of the SOC adjusting section are housed in an integrated circuit.

2. The cell controller according to claim 1, wherein the control unit exercises control so that the unit cells whose voltages are to be detected are switched at predetermined times.

3. The cell controller according to claim 2, wherein the control unit exercises control so that SOC adjustment is not performed simultaneously among unit cells adjacently disposed at higher and lower sides of each of unit cells constituting the battery group.

4. The cell controller according to claim 3, wherein the control unit exercises control so that the unit cells to be adjusted are switched, at predetermined times, between odd-numbered unit cells and even-numbered unit cells enumerated from a highest or lowest cell constituting the battery group.

5. The cell controller according to claim 1, wherein resistors, except the resistors connected to a positive electrode of a highest unit cell and a negative electrode of a lowest unit cell out of the unit cells constituting the battery group, are disposed near the unit cells constituting the battery group.

6. The cell controller according to claim 1, further comprising capacitors connected in parallel through the resistors to each of the unit cells constituting the battery group, wherein the resistors and the capacitors function as a RC filter.

7. The cell controller according to claim 6, wherein the cell controller controls a battery group operating as a power source for a hybrid electric vehicle.

8. A cell controller, comprising:
  an integrated circuit disposed so as to correspond to a battery group, the battery group configured by connecting a plurality of unit cells in series electrically, and which is electrically connected to each of a positive electrode and a negative electrode of the plurality of unit cells through respective voltage detecting lines; and
  a resistor in series in each of the voltage detecting lines,
wherein the integrated circuit comprises:
  a voltage detecting section which detects a voltage of each of the plurality of unit cells, the voltage input from a corresponding voltage detecting line and resistor;
  a plurality of switching elements which are disposed so as to correspond to each of the plurality of unit cells, the plurality of switching elements are switched to an ON state when capacity adjusting of unit cells to be adjusted is necessary in order to connect a resistor which functions as a capacity adjusting resistor to the unit cells to be adjusted; and
  a control unit which is mounted in a control board and which exercises ON/OFF control of the plurality of switching elements, wherein the control unit switches plural switching elements to an OFF state at a time of voltage detection based on the voltage detecting section,
wherein all or part of the resistors are disposed near the unit cells outside the control board,
wherein the control unit detects a voltage of a particular unit cell and simultaneously performs capacity adjustment to other unit cells which are not immediately adjacent to the particular unit cell,
wherein, when a voltage of a first unit cell of the plurality of unit cells is detected, a first switch of the plurality of switching elements corresponding to the first unit cell is turned off to detect a voltage of the first unit cell, and, at a same time:
  a second switch of the plurality of switching elements corresponding to a second unit cell of the plurality of unit cells which is immediately adjacent to and connected electrically with the first unit cell is turned off, and another switch of the plurality of switching elements, corresponding to another unit cell of the plurality of unit cells, performs SOC adjustment to the another unit cell by turning the corresponding switch on to discharge power of the another unit cell, or
  a second switch corresponding to a second unit cell of the plurality of unit cells which is immediately adjacent to and connected electrically with the first unit cell is turned off and a third switch corresponding to a third unit cell of the plurality of unit cells which is immediately adjacent to and connected electrically with the first unit cell is turned off, and another switch corresponding to another unit cell of the plurality of unit cells, performs SOC adjustment to the another unit cell by turning the corresponding switch on to discharge power of the another unit cell, and wherein the voltage detecting section, the switching elements and control unit are housed in the integrated circuit.

9. The cell controller according to claim 8, wherein, when capacity adjusting of unit cells to be adjusted is necessary, the control unit controls switching elements corresponding to the unit cells to be adjusted to an ON state for a time during the voltage detection which is carried out periodically.

10. The cell controller according to claim 9, wherein the control unit exercises control so that unit cells to be adjusted for a time during the voltage detection which is carried out periodically are switched between odd-numbered unit cells and even-numbered unit cells enumerated from a highest or lowest cell constituting the battery group.

11. A cell controller comprising:
a plurality of battery unit cells, each battery unit cell connected in series to another battery unit cell;
a plurality of capacitors;
a plurality of switch elements;
a control unit mounted in a control board; and
a voltage detection section,
wherein:
each battery unit cell is connected to the voltage detection section via voltage detection lines, each voltage detection line having a series-connected resistor between the battery unit cell and the voltage detection section, wherein the resistor is disposed near the unit cells outside the control board,
a capacitor and a switch element are connected in parallel to each battery unit cell, and
the control unit switches one or more of the plurality of switching elements,
wherein the control unit switches the switching elements to an OFF state at a time of voltage detection based on the voltage detecting section, and wherein the control unit detects a voltage of a particular unit cell and simultaneously performs capacity adjustment to other unit cells which are not immediately adjacent to the particular unit cell,
wherein, when a voltage of a first unit cell of the plurality of unit cells is detected, a first switch of the plurality of switching elements corresponding to the first unit cell is turned off to detect a voltage of the first unit cell, and, at a same time:
a second switch of the plurality of switching elements corresponding to a second unit cell of the plurality of unit cells which is immediately adjacent to and connected electrically with the first unit cell is turned off, and another switch of the plurality of switching elements, corresponding to another unit cell of the plurality of unit cells, performs SOC adjustment to the another unit cell by turning the corresponding switch on to discharge power of the another unit cell, or
a second switch corresponding to a second unit cell of the plurality of unit cells which is immediately adjacent to and connected electrically with the first unit cell is turned off and a third switch corresponding to a third unit cell of the plurality of unit cells which is immediately adjacent to and connected electrically with the first unit cell is turned off, and another switch corresponding to another unit cell of the plurality of unit cells, performs SOC adjustment to the another unit cell by turning the corresponding switch on to discharge power of the another unit cell, and wherein plural switching elements are switched to an ON state when capacity adjusting of one or more of the battery unit cells is necessary, the switching to an ON state connecting the resistor which functions as a capacity adjusting resistor across the battery unit cell, and wherein the control unit switches plural switching elements to an OFF state based on the voltage detecting section, wherein the voltage detecting section, the switch elements and control are housed in an integrated circuit.

12. A cell controller, comprising:
an integrated circuit disposed so as to correspond to a battery group, the battery group configured by connecting a plurality of unit cells in series electrically, and which is electrically connected to each of a positive electrode and a negative electrode of the plurality of unit cells through respective voltage detecting lines; and
a resistor in series in each of the voltage detecting lines,
wherein the integrated circuit comprises:
a voltage detecting section which detects a voltage of each of the plurality of unit cells, the voltage input from a corresponding voltage detecting line and resistor;
a plurality of switching elements which are disposed so as to correspond to each of the plurality of unit cells, the plurality of switching elements are switched to an ON state when capacity adjusting of unit cells to be adjusted is necessary in order to connect a resistor which functions as a capacity adjusting resistor to the unit cells to be adjusted; and
a control unit which is mounted in a control board and which exercises ON/OFF control of the plurality of switching elements, wherein the control unit switches plural switching elements to an OFF state at a time of voltage detection based on the voltage detecting section,
wherein all or part of the resistors are disposed near the unit cells outside the control board,
wherein the control unit detects a voltage of a particular unit cell and simultaneously performs capacity adjustment to other unit cells which are not immediately adjacent to the particular unit cell, and wherein, when a voltage of a first unit cell of the plurality of unit cells is detected, a first switch of the plurality of switching elements corresponding to the first unit cell is turned off to detect a voltage of the first unit cell, and, at a same time:
a second switch of the plurality of switching elements corresponding to a second unit cell of the plurality of unit cells which is immediately adjacent to and connected electrically with the first unit cell is turned off, and another switch of the plurality of switching elements, corresponding to another unit cell of the plurality of unit cells, performs SOC adjustment to the another unit cell by turning the corresponding switch on to discharge power of the another unit cell, or
a second switch corresponding to a second unit cell of the plurality of unit cells which is immediately adjacent to and connected electrically with the first unit cell is turned off and a third switch corresponding to a third unit cell of the plurality of unit cells which is immediately adjacent to and connected electrically with the first unit cell is turned off, and another switch corresponding to another unit cell of the plurality of unit cells, performs SOC adjustment to the another unit cell by turning the corresponding switch on to discharge power of the another unit cell.

* * * * *